April 4, 1967 W. M. ROBINSON 3,311,967

METHOD OF MANUFACTURING ENCAPSULATED COMPONENTS

Original Filed July 30, 1962

INVENTOR.
William M. Robinson
BY
Paul S. Martin
ATTORNEY

United States Patent Office 3,311,967
Patented Apr. 4, 1967

3,311,967

METHOD OF MANUFACTURING ENCAPSULATED COMPONENTS

William M. Robinson, Fairhaven, Mass., assignor to Cornell-Dubilier Electric Corporation, a corporation of Delaware Original application July 30, 1962, Ser. No. 213,305, now Patent No. 3,236,936, dated Feb. 22, 1966. Divided and this application Aug. 23, 1965, Ser. No. 493,953
2 Claims. (Cl. 29—155.5)

This application is a division of my application Ser. No. 213,305, filed July 30, 1962, now U.S. Patent No. 3,236,936, entitled, Miniature Electrical Component With Protected Terminal-Wire Connections.

The present application relates to electrical components and particularly to capacitors.

The following discussion is addressed particularly to encapsulated capacitors inasmuch as the invention has special application to capacitors. However, except where the context may so require, the illustrative disclosure is not to be construed as limiting.

In the manufacture of capacitors, among the various critical problems are the provision of a connection between a terminal wire and a film or foil electrode of the capacitor section. Another problem involves the provision of an insulating case for the capacitor that will exclude deleterious moisture. An object of the present invention resides in the provision of a novel encapsulated component affording vastly improved resistance to mechanical damage, to the moisture-proof characteristic of the encapsulation, and to the terminal connections, where mechanical stresses may be imposed on the leads or terminal wires that extend external of the encapsulated unit.

The illustrative embodiment of the invention includes a wound capacitor unit of the so-called extended-foil type. Lead wires are joined to the wound section and extend away from the section parallel to each other. A wafer of a tough material such as nylon is disposed adjacent the capacitor section and has holes through which the wires extend. The capacitor section, the wafer and portions of the lead wires that extend through the wafer to the capacitor section are encapsulated within a hard moisture-excluding insulation that is applied as a coating.

The wafer is extremely tough and, before it is encapsulated, it may readily be twisted and flexed. The encapsulating coating is also quite brittle, separately. However, where the insulating wafer is contained and encapsulated in the same coating that encapsulates the capacitor section, the wafer and the insulating coating are each effective to modify the characteristics of the other. As a result, mechanical stresses imposed on the leads have no tendency to twist or bend the wafer that is separately susceptible to bending and twisting, and the leads have no tendency to crack the encapsulation formed about the capacitor section when the leads are constrained by the encapsulated wafer. Further, the encapsulated wafer adjacent the capacitor section prevents stresses imposed on the external portions of the wire from being applied to the joints between each wire and the foil of the capacitor section. This latter consideration is of special concern where (as in the illustrative embodiment below) very small components are involved, and where the joint between the wire and the section terminal is of a character that is inherently weak mechanically.

In the manufacture of a capacitor of the foregoing construction, as will be seen in the illustrative disclosure which follows, the capacitor section is interposed between the ends of the lead wires while those wires extend through spaced-apart holes in the insulating wafer, the wires being thereby accurately spaced. While being thus held, joints are made between the ends of the wires and the terminals of the capacitor section. In one form, the joint may be made by electrically welding the wires to the extended foils of the capacitor section, or a soldering operation might be used. However, the connection is made, with spacial advantage, by means of a conductive thermal-setting resin such as conductive epoxy paste. It is clear, accordingly, that the insulating wafer which provides enhanced physical characteristics in the completed unit, is also effective during the fabrication of the unit for supporting the lead wires with the desired spacing for the capacitor section for providing mechanical protection for the connections between the lead wires and the capacitor section even before the unit has been encapsulated.

Accordingly, a further aspect of the invention resides in the method of manufacture of capacitors and the like, for facilitating such manufactures and for providing improved mechanical properties of the unit during the fabricating procedure.

The nature of the invention and its various further aspects and features of novelty will be appreciated from the illustrative disclosure that is given in detail below, and from the accompanying drawings which form part of this disclosure. In the drawings.

Figure 1:
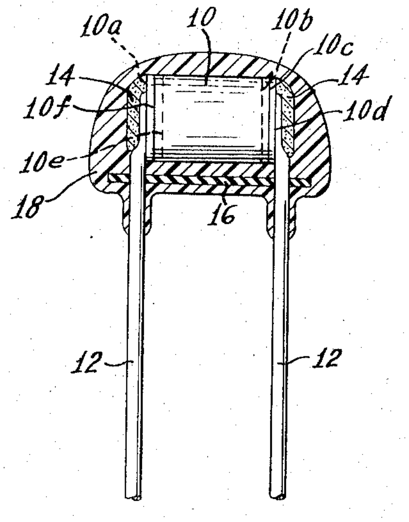
FIG. 1 is an enlarged cross sectional view of a capacitor embodying features of the invention.
Figure 2:
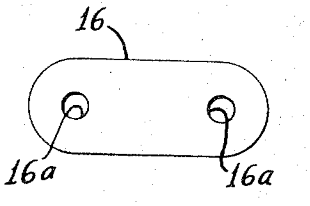
FIG. 2 is an enlarged plan view of a wafer which is shown in section FIG. 1.
Figure 3:
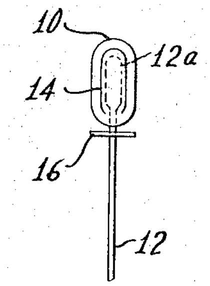
FIG. 3 is an enlarged end view of the components in FIG. 1 prior to encapsulation.
Figure 4:
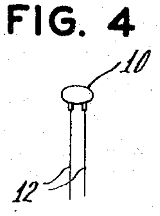
FIG. 4 is an approximately accurate full-size view of a typical capacitor such as that illustrated in FIG. 1.

Referring now to the drawings, a capacitor section 10 is shown having terminals that are connected to lead wires 12 by means of conductive epoxy cement 14. As illustrated in FIG. 3, lead wires 12 have flattened end portions 12*a* that are covered by the conductive cement 14. Capacitor section 10 is of a conventional construction commonly termed "extended-foil" section, wherein two strips of metal foil are concentrically wound, the successive convolutions being separated from each other by wound strips of dielectric material. One strip of foil is shifted axially relative to the other foil and the dielectric strips so that its edge projects at one end of the wound section whereas the other foil has its edge disposed outward of the edges of the dielectric strip at the opposite end of the wound section. The projected foil 10*a* has its opposite edge 10*b* recessed relative to the edge 10*c* of the dielectric material. By like token, the projected foil 10*d* has an inwardly offset edge 10*e* that is recessed relative to the opposite edge 10*f* of the insulating dielectric strip and relative to the projected-foil edge 10*a*. Such wound extended-foil capacitor sections are well-known. They can be cade extremely small and have relatively large values of capacitance where the dielectric strips used are of extremely thin material such as 0.00015 Mylar. Where such units are extremely small the customary difficulty of making connection to the foils, which are almost always of aluminum, is made even more difficult. Also, where the capacitor section is extremely small, the possibility of damage resulting from soldering or even from spot-welding may be a problem, but the problem is avoided by use of conductive cement, particularly conductive epoxy cement.

A wafer 16 of insulating material such as nylon is disposed adjacent the capacitor section 10. The lead wires 12 extend through holes 16*a* in the wafer with the flat end portions 12*a* of the wires adjacent the wafer. The wires 12 are tightly held and accurately positioned by the wafer 16. This is extremely useful during the further assembly operation in the manufacture of capacitors since the lead wires 12 are precisely located and snugly accommodate the capacitor section 10 therebetween. The wafer 16 is tough i.e., strong but flexible and not brittle. The thickness of the wafer relative to its width and length is selected so that it is relatively inextensible. Once the capacitor body has been positioned between the opposed lead ends 12*a* the previously described conductive epoxy cement 14 is applied to physically and electrially bond the lead wires to the opposed ends of the capacitor section 10.

The capacitor section 10, lead wires 12, and wafer 16 are then united into a mechanically strong and hermetically sealed capacitor unit 18 by a hard moisture-excluding insulation 20 that is applied as a coating. Encapsulating coatings, selected from thermosetting epoxy resins having the desired insulating and moisture excluding characteristics, are usually quite brittle, separately. However, where the insulator wafer 16 is contained and encapsulated in the same coating 20 that encapsulates the capacitor section 10, the wafer and the insulating coating are each effective to modify the characteristics of the other. The capacitor section 10, wafer 16, and adjacent portions 12*a* of the lead wires 12 are immersed in a liquid epoxy coating which is then set as by baking. The wafer is surrounded and supported by the epoxy coating 18 which effectively "rigidizes" the wafer. The depth of immersion or dipping is carefully controlled to minimize the extent of the coating 18 on the lead wires 12 beyond the wafer 16. As a result of the hard coating 18 being present about the wafer, mechanical stresses imposed on the lead wires 12 have no tendency to twist or bend the wafer 16. Further, because of the restraint imposed by the relatively inextensible wafer, the leads have no tendency to crack the hard encapsulating coating 18. The effects of the mechanical stresses on the joints between the lead wires 12 and wound section 10, such as encountered during installation or during use of the capacitor, are minimized by the wafer 16 which is rigidized by the hard coating 18.

The above described method and construction may be utilized to great advantage in the production of other types of encapsulated components. The toughness of the wafer allows the selection and use of encapsulating coatings which might otherwise not be selected even though they have certain other desirable characteristics such as high insulation value, good thermal conductivity, or good moisture-excluding properties.

Although one embodiment of the invention has been shown and described, it will be apparent to those skilled in the art that various applications and modifications may be made of the novel features without departing from the spirit and scope of the invention.

What I claim is:

1. The method of manufacturing an encapsulated component including the steps of frictionally inserting two individual lead wires into spaced apart lead wire receiving apertures in a wafer of tough, relatively inextensible insulation material so that said lead wires have aligned ends projecting beyond said wafer for receiving and resiliently engaging said component therebetween, said apertures being spaced apart the length of the component to be encapsulated, inserting said component to be resiliently engaged and held between and by said aligned ends of said lead wires with the terminal portions of said component in registration with said projecting ends of said lead wires, mechanically and electrically joining said projecting ends and said terminal portions of said component, and encapsulating said wafer, said component, and said projecting ends of said lead wires in a moisture-excluding, hard, relatively brittle insulation coating to rigidize said wafer and form the exterior of said encapsulated component.

2. The method of manufacturing an encapsulated capacitor which has a wound capacitor section of the extended foil type, said capacitor section being provided with terminal portions at the opposite ends thereof, including the steps of frictionally inserting two individual lead wires each having a flattened end portion into spaced apart lead wire receiving apertures in a wafer of tough relatively inextensible insulation material, so that said lead wires have said flattened end portions aligned with one another and projecting beyond said wafer for receiving and resiliently engaging said capacitor section therebetween, said apertures being spaced apart the length of said capacitor section, inserting said capacitor section to be resiliently engaged and held between and by said ends of said lead wires with said flattened ends of said lead wires in engagement with said terminal portions of said capacitor section, mechanically and electrically joining said flattened wire ends and said capacitor section, and encapsulating said wafer, said capacitor section, and said flat ends of said lead wires in a moisture-excluding hard, relatively brittle, insulation coating to rigidize said wafer, and form the exterior of said capacitor.

References Cited by the Examiner

UNITED STATES PATENTS

| | | | |
|---|---|---|---|
| 2,413,539 | 12/1946 | Ballard | 339—275 X |
| 2,745,045 | 5/1956 | Ingram | 264—272 X |
| 2,766,510 | 10/1956 | Heibel. | |
| 2,809,332 | 10/1957 | Sherwood | 264—272 X |
| 2,857,560 | 10/1958 | Schnable et al. | 264—272 X |
| 2,954,117 | 9/1960 | Freeburg. | |
| 3,110,787 | 11/1963 | Borzoni | 200—120 X |
| 3,111,612 | 11/1963 | Lehmann | 317—101 X |
| 3,227,841 | 1/1966 | Gaia | 200—120 X |

JOHN F. CAMPBELL, *Primary Examiner.*

R. W. CHURCH, *Assistant Examiner.*